United States Patent [19]

Maeda et al.

[11] Patent Number: 4,931,407

[45] Date of Patent: Jun. 5, 1990

[54] METHOD FOR MANUFACTURING INTEGRATED BIPOLAR AND MOS TRANSISTORS

[75] Inventors: Takeo Maeda, Kawasaki; Koji Makita, Yokohama, both of Japan

[73] Assignee: Kabushiki Kaisha Toshiba, Kawasaki, Japan

[21] Appl. No.: 211,010

[22] Filed: Jun. 24, 1988

[30] Foreign Application Priority Data

Jun. 25, 1987 [JP] Japan .................................. 62-156443
Aug. 31, 1987 [JP] Japan .................................. 62-216666

[51] Int. Cl.$^5$ .......................................... H01L 21/265
[52] U.S. Cl. ........................................ 437/45; 437/46; 437/47; 437/49; 437/50; 437/59; 437/60; 357/43
[58] Field of Search ..................... 437/45, 46, 47, 49, 437/50, 57, 59, 60; 357/43

[56] References Cited

U.S. PATENT DOCUMENTS

| 4,637,125 | 1/1987 | Iwasaki et al. ................. 437/59 |
| 4,717,686 | 1/1988 | Jacobs et al. ................... 437/31 |
| 4,721,686 | 1/1988 | Contiero et al. ................ 437/31 |
| 4,727,046 | 2/1988 | Tuntasood et al. ............. 437/54 |
| 4,764,482 | 8/1988 | Hsu ................................. 437/57 |

FOREIGN PATENT DOCUMENTS

| 0097379 | 1/1984 | European Pat. Off. .......... 437/59 |
| 0224712 | 6/1987 | European Pat. Off. .......... 437/59 |

Primary Examiner—Olik Chaudhuri
Attorney, Agent, or Firm—Finnegan, Henderson, Farabow, Garrett, and Dunner

[57] ABSTRACT

A method for manufacturing MOS and bipolar transistors is proposed which includes MOS and bipolar transistors. The method comprises implanting impurity ions in a channel formation region with a dummy gate insulating film interposed and, subsequent to forming a gate oxide film on the surface of the resultant structure, impurity ions are implanted into an internal base region of the bipolar transistor.

11 Claims, 5 Drawing Sheets

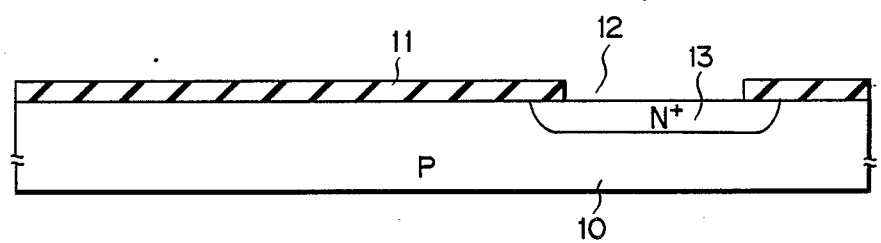
F I G. 1A
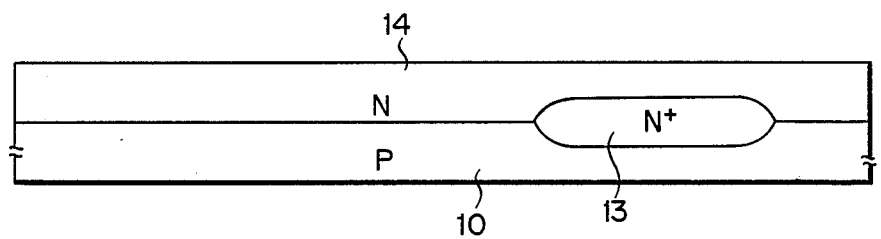
F I G. 1B
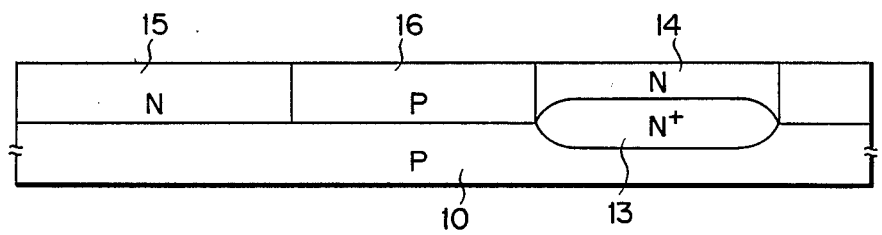
F I G. 1C

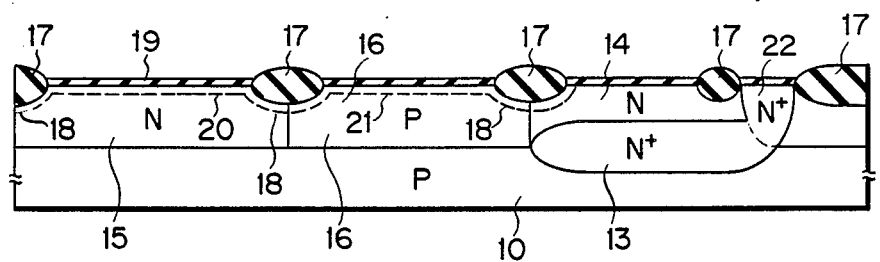
F I G. 1D
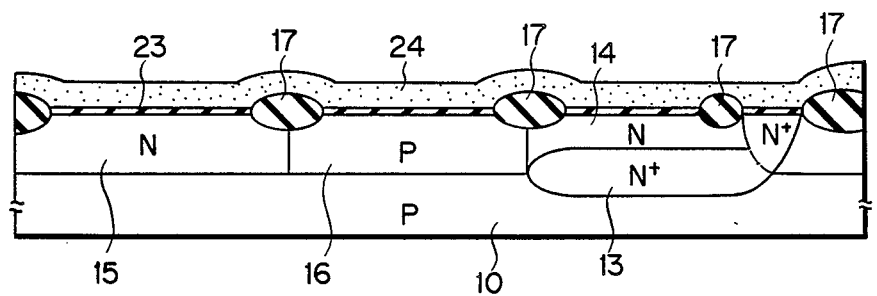
F I G. 1E
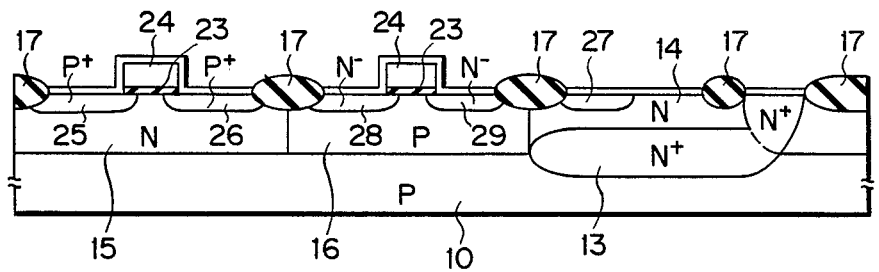
F I G. 1F

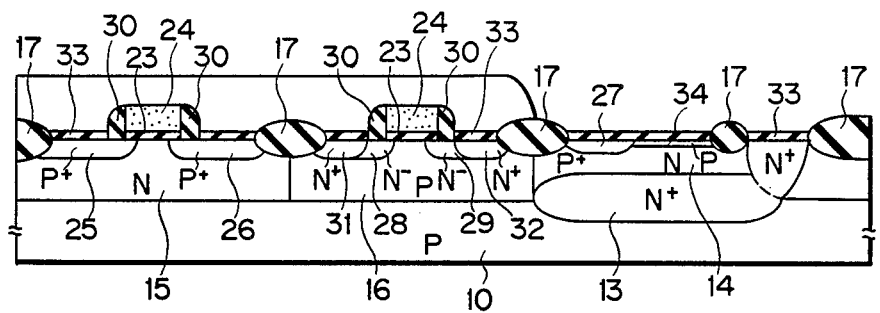
F I G. 1 G
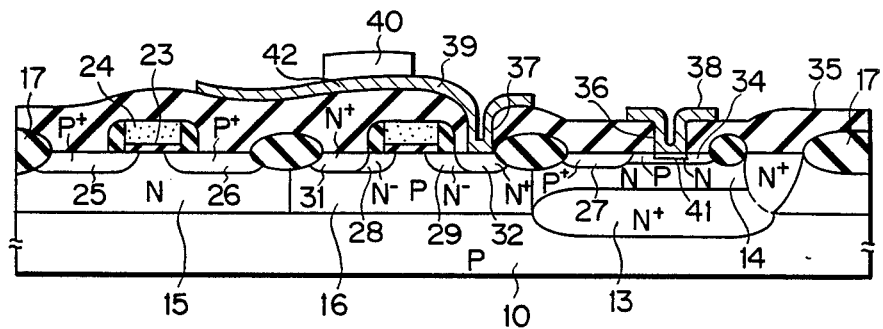
F I G. 1 H
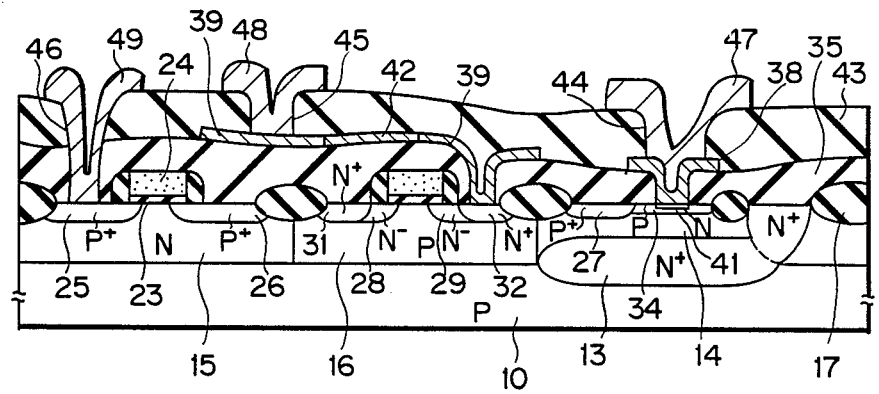
F I G. 1 I

4,931,407

METHOD FOR MANUFACTURING INTEGRATED BIPOLAR AND MOS TRANSISTORS

BACKGROUND OF THE INVENTION

1. Field of the Invention

The present invention relates to a method for manufacturing a semiconductor device having bipolar and MOS transistors on one semiconductor substrate.

2. Description of the Related Art

In the formation of P- and N-channel MOS and bipolar transistors on a common substrate, an internal base region of the bipolar transistor is formed by the same step as a channel ion implantation step for the MOS transistor and, subsequent to forming the gate electrode of the MOS transistor, an external base region of the bipolar transistor is formed simultaneously with the formation of the source and drain regions of the P-channel MOS transistor.

In this conventional method, it is possible to simultaneously form the emitter electrode of the bipolar transistor and gate electrode of the MOS transistor. In the formation of a microminiaturized MOS transistor of high reliability it is required that a gate oxide film be formed subsequent to the channel ion implantation step and, since the formation of the gate oxide film of the MOS transistor is formed after the formation of an internal base region of the bipolar transistor, the depth xj of the internal base region will be increased due to an oxidation enhanced diffusion during the gate oxidation step. This causes an increase in the base width of the internal base region, largely degrading the characteristic of bipolar transistors. In the conventional method, it is not possible to form a high performance bipolar transistor because the internal base region of the bipolar transistor is formed at the same step as the channel ion implantation step for MOS transistors.

It is particularly important to form a gate oxide film as a thin one in the formation of microminiaturized MOS transistors. In the formation of a thin gate oxide film and hence a MOS capacitor of high reliability, ion implantation cannot be carried out subsequent to forming the gate oxide film. Since, therefore, a dummy gate oxide film is formed prior to the channel ion implantation step and then that channel ion implantation is carried out, a gate oxide film needs to be formed after the removal of the dummy gate film. Upon implantation of ions into the internal base in the same way as the conventional step, the internal base width will be made broader due to the OED (oxidation enhanced diffusion), so that the characteristics of bipolar transistors are greatly deteriorated.

SUMMARY OF THE INVENTION

It is accordingly an object of the present invention to provide a method for manufacturing a semiconductor device which can form, together with MOS transistors, high performance bipolar transistors on a common substrate.

In one aspect of the present invention, a method for manufacturing a semiconductor device is provided which comprises the steps of implanting impurity ions into a channel formation region on a MOS transistor with a dummy insulating film interposed when bipolar and MOS transistors are formed on a semiconductor substrate and, subsequent to forming a gate insulating film, implanting impurity ions in an internal base region of the bipolar transistor. That is, according to the present invention, impurity ions are implanted into a channel formation region with a dummy gate insulating film interposed so as to secure the reliability of the gate insulating film which has otherwise not been obtained in the conventional techniques. In order to prevent the aforementioned oxidation enhanced diffusion, on the other hand, the internal base region is formed by the ion implantation method subsequent to forming the gate insulating film, not the aforementioned dummy gate insulating film. In order to lower the emitter resistance, lower the resistance of the gate poly-Si layer and raise the reliability of the gate oxide film, a dummy poly-Si layer is first deposited on the semiconductor structure and, subsequent to forming an opening over an emitter with the poly-Si layer interposed, a poly-Si layer 100 to 2000 Å thick is deposited on the surface of the resultant structure to allow the formation of the emitter electrode and gate poly-Si area. As ions are implanted at an acceleration voltage of 40 to 100 KeV and dose of $5 \times 10^{15}$ cm$^{-2}$ to $2 \times 10^{16}$ cm$^{-2}$ with the poly-Si layer interposed, thereby destroying a natural oxide in a poly-Si layer-to-semiconductor layer interface. Furthermore, a heat treatment is conducted on the semiconductor structure for 10 to 60 seconds at 950° to 1100° C., for thermally destroying that natural oxide In order to prevent formation of natural oxide to a maximum possible extent, various processings can be performed, such as a ramp-up step done from room temperature, a purging step done with H$_2$ and a step for introducing a H$_2$ carrier gas, or a step for removing natural oxide at a place within the deposition device, at the time of forming a poly-Si deposition layer.

In another aspect of the present invention, a method for manufacturing a semiconductor device is provided which comprises the steps of implanting impurity ions in a MOS transistor formation area of a semiconductor substrate; forming a gate electrode over the MOS transistor formation area, forming source and drain regions of the MOS transistor by implanting impurity ions into the surface portion of the semiconductor structure with the gate electrode used as a mask; forming an external base region by implanting impurity ions in a bipolar transistor formation area; forming an internal base region, connected to the external base region, by implanting impurity ions into the bipolar transistor formation area; depositing an insulating interlayer on the whole surface of the semiconductor structure; forming into the insulating interlayer an opening reaching the surface of the internal base region; subsequent to depositing a poly-Si layer on the whole surface of the resultant structure, leaving some poly-Si layer at least near the aforementioned opening; and forming an emitter region and emitter electrode of the bipolar transistor by implanting impurity ions into the internal base region with the poly-Si interposed.

In the aforementioned manufacturing method, in order to prevent the base width of the bipolar transistor from being broadened, the internal base region of the bipolar transistor is formed subsequent to forming the MOS transistor. When this is done, it is possible to prevent a possible oxidation enhanced diffusion in the bipolar transistor during an oxidation phase of a gate insulating film formation time of the MOS transistor which has posed a problem in the conventional method. It is accordingly possible to reduce the base width and to obtain a high-performance bipolar transistor.

BRIEF DESCRIPTION OF THE DRAWINGS

FIGS. 1A to 1I show the steps of manufacturing a semiconductor device according to one embodiment of the present invention.

DETAILED EXPLANATION OF THE EMBODIMENTS

Figure 2A:
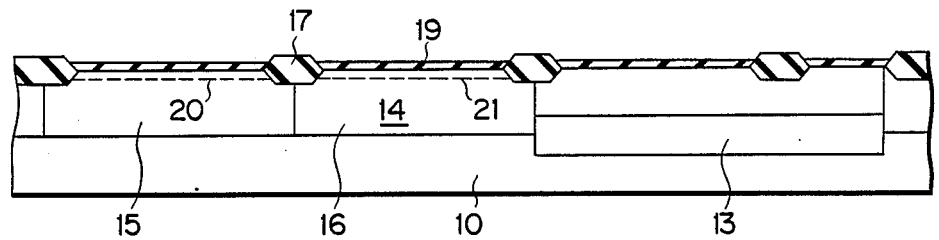
FIGS. 2A to 2E show the steps of manufacturing another embodiment of the present invention.

FIGS. 1A to 1E are cross-sectional views of the manufacturing the steps of a semiconductor device according to one embodiment of the present invention.

Insulating film 11 is deposited on a (100) crystal face of P type silicon semiconductor substrate 10 and selectively removed by a photoetching method only at an embedded collector region formation area to leave opening 12. Then $N^+$ type buried collector region 13 is formed by diffusing Sb by a gas phase diffusion method, or As or Sb by an ion implantation method, into collector region 13 via opening 12—FIG. 1. At this time, a buried P-region may be formed simultaneously.

After wholly removing insulating film 11, N type epitaxial layer 14 containing about $2 \times 10^{16}/cm^3$ of phosphorus (P) as an impurity is formed by an epitaxial growth method on the surface of the resultant structure at which time layer 14 of, for example, 1.2 μm in thickness is formed at, for example, 1130° C.—FIG. 1B. A P type epitaxial layer may be grown on the surface in place of N type epitaxial layer 14. In this case, the P type epitaxial layer containing about $2 \times 10^{15}/cm^3$ of B as an impurity is formed on that surface.

A mask, not shown, for ion implantation is formed with the use of a photoetching method and, with the use of the mask, P ions are implanted in aforementioned N type epitaxial layer 14 at an acceleration energy of 160 KeV and a dose of $5 \times 10^{12}/cm^2$ with the use of the mask to selectively form N well region 15. Then B ions are implanted at an acceleration energy of 100 KeV and dose of $6 \times 10^{12}/cm^2$ with the use of another mask for ion implantation of selectively form P well region 16—FIG. 1C. In this case, P well region 16 may be formed, followed by the formation of N well region 15. At the aforementioned step, during the growth of the P type epitaxial layer, P ions for example are implanted to form an N well region over the collector region.

Field oxide film 17 is formed by an ordinary LOCOS method to provide an isolation between MOS transistors as well as between the MOS transistor and the bipolar transistor. The field oxide film is about 6000 Å in thickness. It is to be noted that, prior to the formation of field oxide film 17, ion implanted region 18 for field inversion prevention is formed in a self-aligned fashion. Then about 150 Å-thick dummy gate oxide film 19 is formed by a thermal oxidation method on the whole surface of the resultant structure in an $O_2$ atmosphere at 800° C. Then channel ion implanted regions 20 and 21 for P- and N-channel MOS transistor threshold level setting and for punch-through prevention are formed in N- and P-well regions 15 and 16, respectively. Channel ion implanted region 20 on the side of that N well region are formed by two ion implantation steps, one for implanting B ions at an acceleration energy of 20 KeV and dose of $3 \times 10^{12}/cm^2$ and one for implantation P ions at an acceleration energy of 240 KeV and $2 \times 10^{12}/cm^2$. Channel ion implanted region 21 on the side of P well region 16 is formed by the ion implantation method at an acceleration energy of 20 KeV and dose of $4 \times 10^{12}/cm^2$. By implanting P ions into N type epitaxial layer 14 at an acceleration energy of 320 KeV and dose of $1 \times 10^{16}/cm^2$, deep $N^+$ type ion implanted region 22 is formed which is connected to buried collector region 13—FIG. 1D.

After dummy gate oxide film 19 has wholly been removed by $NH_4F$, about 150 Å-thick gate oxide film 28 is formed in an $O_2 + 10\%$ HCl atmosphere at 900° C. Poly-Si layer 24 is so deposited by a CVD (chemical vapor deposition) method on the surface of the resultant structure as to have a thickness of 1500 Å. Then a phosphorus impurity is diffused into poly-Si layer 24 to provide a low resistance area—see FIG. 1E.

Then poly-Si layer 24 and gate oxide film 23 are patterned by a photoetching method to leave gate electrodes of the MOS transistors over N- and P-well regions 15 and 16, respectively, in which case poly-Si layer 24 and gate oxide film 23 are etched by an RIE (reactive ion etching) method and $NH_4F$, respectively. Then $BF_2+$ ions are implanted into the surface portion of the resultant structure at an acceleration energy of 50 KeV and dose of $\times 10^{15}/cm^2$ with field oxide film 17 and gate electrode as a mask to provide P+ type source and drain regions 25 and 26, respectively, in the surface portion of N-well region 15. Impurity ions are implanted into N type epitaxial layer 14 over buried collector layer 13 with the use of $BF_2$ to form external base region 27 for a bipolar transistor. Then P+ ions are implanted into the surface of the resultant structure at an acceleration energy of 60 KeV and dose of $4 \times 10^{13}/cm^2$ with field oxide film 17 and the gate electrode as a mask to provide N- type source and drain regions 28 and 29 in the surface of P-well region 16—FIG. 1F.

Then 2000 Å-thick CVD-$SiO_2$ film 30 is deposited on the whole surface of the resultant structure and etched by an anisotropic etching, such as the RIE, to allow the side surface of the gate electrode to be covered with a left CVD-$SiO_2$. Subsequent to forming a mask, not shown, which allows only P-well region 16 to be exposed, As ions are implanted at an acceleration of 50 KeV and dose of $5 \times 10^{15}/cm^2$ to provide N+ type source and drain regions 31 and 32 in the surface portion of P-well region 16. That is, an N-channel MOS transistor of an LDD structure is formed in P-well region 15. The resultant structure is oxidized for 30 minutes at 900° C. in an oxyzen atmosphere to form oxide film 33. Subsequent to covering the surface of P- and N-well regions 15 and 16 with, for example, a photoresist, $BF_2+$ ions are implanted at an acceleration energy of 30 KeV and dose of $5 \times 10^{13}/cm^2$ of form P type internal base region 34 in N type epitaxial layer 14 overlying buried collector region 13—FIG. 1G.

Then 2000 Å-thick CVD $SiO_2$ film 35 is deposited as an insulating interlayer on the whole surface of the resultant semiconductor structure and contact holes 36 and 37 are formed in CVD $SiO_2$ film 35 in a manner to reach the surfaces of internal base region 34 and N+ type drain region 32, respectively. A 500 Å-thick poly-Si layer is deposited on the surface of the resultant structure and a patterning step is carried out to leave poly-Si layers 38 and 39 only to be formed for an emitter electrode and high resistance element.

Subsequent to covering a portion of poly-Si layer 39 with mask 40, such as a photoresist mask, As ions are implanted into poly-Si layers 38 and 39 at an acceleration energy of 50 KeV and dose of $5 \times 10^{15}/cm^2$ to form N type emitter region 41 in internal base region 33 and, at the same time, poly-Si layer 38 is made low-ohmic to provide an emitter electrode for a bipolar transistor and poly-Si layer 39 is partially removed for low resistance to provide a drain line for an N-channel MOS transistor and a high resistance element 42—FIG. 1H. At this time, a very thin oxide film present at a boundary to poly-Si layers 38 and 39 (poly-Si layer) is destroyed by means of an As ion implantation. At the time of ion implantation, if proper values are selected from an acceleration energy range of 40 to 100 KeV and dose range of $5 \times 10^{15}/cm^2$ to $2 \times 10^{16}/cm^2$, it is possible to destroy the aforementioned oxide film and hence to obtain an excellent contact characteristic. Subsequent to the ion implantation step, a so-called "rapid anneal" step is carried out, as a heat treatment step, for 5 seconds to 1 minute at 950° to 1100° C., obtaining an excellent contact characteristic.

It is also important to take care not to allow natural oxide to be formed at the time of poly-Si deposition. To this end, various ingenious concepts are employed at the poly-Si deposition step, such as a ramp-up step for gradually raising a prevalent temperature at the load time within the apparatus chamber from as low a level as possible while introducing a reducing gas, such as hydrogen or chlorine, or introducing a reducing gas, such as hydrogen, as a carrier gas. Prior to forming the poly-Si deposition layer within the apparatus, a reducing gas, such as hydrogen, or a radical gas containing F atoms, may be introduced into the apparatus chamber under a high temperature atmosphere of above 600° C. to prevent the formation of natural oxide. In this case, it is possible to obtain a 1000 to 4000 Å-thick poly-Si deposition layer, provided that an amount of As ions to be implanted is preferably 5 to $20 \times 10^{15}$ at 40 to 60 KeV. Subsequent to the ion implantation step, a rapid anneal is performed, as a heat treatment, at 950 to 1100° C. for 5 seconds to 1 minute, thus obtaining an excellent contact characteristic. The rapid anneal conducted subsequent to a heat treatment at above 850° C. at the step of planarizing a BPSG film is important to the control of the emitter's Xj and $h_{FE}$.

Subsequent to depositing insulating interlayer 43, comprising the CVD-SiO$_2$ film and BPSG film, on the semiconductor structure and planarizing the surface of the resultant structure, contact holes 44 and 45 are formed in insulating interlayer 43 with contact hole 44 reaching the surface of poly-Si layer 38 and contact hole 45 reaching the surface of poly-Si layer 39. At the same time, contact hole 46 is formed in insulating interlayer 43 and underlying CVD SiO$_2$ film 35, reaching the surface of source region 25 of P-channel MOS transistor. Then aluminum for interconnection is deposited by, for example, a vacuum evaporation method on the whole surface of the semiconductor structure and a patterning step is carried out to form aluminum wirings 47, 48 and 49—FIG. 1I.

In the semiconductor device thus fabricated, high resistance element 42 is formed at one portion of poly-Si layer 39 and employed as a load resistor of a static type memory cell.

According to the present invention, the internal base region of the bipolar transistor is not yet formed at the step of FIG. 1E upon forming gate oxide film 23. Since internal base region 34 is formed at the time of forming source and drain regions of N- and P-channel MOS transistors, it is possible to reduce the heat treatment time following the formation of the internal base region, so that the aforementioned depth xj can be made adequately shallower than in the conventional method. In the conventional technique, for example, it is only possible to obtain a bipolar transistor with its current amplification factor $h_{FE}$, its emitter resistor and its cut-off frequency $f_T$ as 100, 1 kΩ and about 4 GHz, respectively. According to the aforementioned embodiment of the present invention, a bipolar transistor was able to be obtained whose current amplification factor $h_{FE}$, emitter resistance and cut-off frequency $f_T$ were 200, 30 Ω and 10 HGz, respectively.

In the aforementioned embodiment, since subsequent to forming internal base region 34 of the bipolar transistor no subsequent heat step is used in an O$_2$ atmosphere, an oxidation-enhanced diffusion can be prevented which has posed a problem in the conventional semiconductor device.

Furthermore, the gate oxide film is formed prior to forming the internal base region of the bipolar transistor and, subsequent to forming the internal base region, the internal base region is not exposed to a high temperature oxygen atmosphere. In this way, it is possible to prevent an oxidation-enhanced diffusion at the internal base region.

FIGS. 2A to 2E show another embodiment based of the aforementioned concept and the common steps 1A to 1I will be explained below with some omitted.

As shown in FIG. 2A, buried layer 13 for a bipolar transistor is formed on a (100) face of semiconductor substrate 10 and N type epitaxial layer 14 is formed on semiconductor substrate 10. The epitaxial layer 1.2 μ thick is formed at a concentration of $2 \times 10^{16}/cm^3$ with the use of a phosphorus impurity. In the element isolation for CMOS and bipolar transistors, P- and N-wells 16 and 15 are formed at the acceleration voltages of 100 KeV and 160 KeV and doses of $6 \times 10^{12}$ and $5 \times 10^{12}$ cm$^{-2}$, respectively, by the implantation of B+ and P+ ions. By the ordinary LOCOS method, an ion implantation for field inversion prevention and formation of field oxide film 17 are carried out. Then dummy gate oxide film 19 of 100 Å in thickness is formed at 800° C. in an O$_2$ atmosphere and a channel ion implantation step is conducted at NMOS and PMOS regions. That is, boron ions are implanted at an acceleration voltage of 20 KeV and dose of $4 \times 10^{12}$ cm$^{-2}$ into channel formation region 21 for an NMOS transistor and boron and phosphorus ions are implanted, respectively, at the acceleration voltages of 20 KeV and 240 KeV and doses of $3 \times 10^{12}$ cm$^{-2}$ and $2 \times 10^{12}$ cm$^{-2}$ into channel formation region 20 for a PMOS transistor.

Figure 2B:
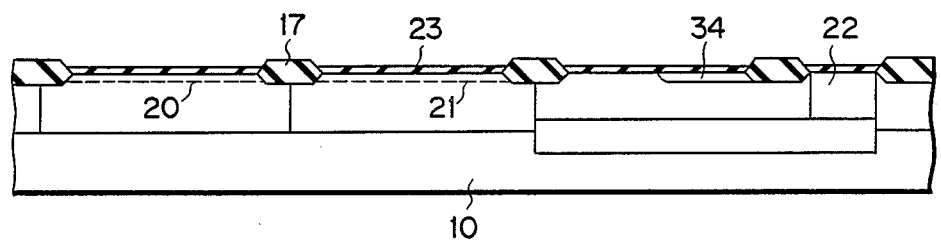

Subsequent to the removal of dummy gate oxide film 19 by NH$_4$F, gate oxide film 23 of 150 Å in thickness is formed at 900° C. in an O$_2$ +10% HCl atmosphere as shown in FIG. 2B. BF$_2$ ions are implanted into the surface portion of the semiconductor structure at an acceleration voltage of 30 KeV and dose of $5 \times 10^{13}$ cm$^{-2}$ to obtain internal base 34. Then P+ ions are implanted at an acceleration voltage of 320 KeV and dose of $1 \times 10^{16}$ cm$^{-2}$ into the surface portion of the semiconductor structure to form deep N+ region 22.

Figure 2C:
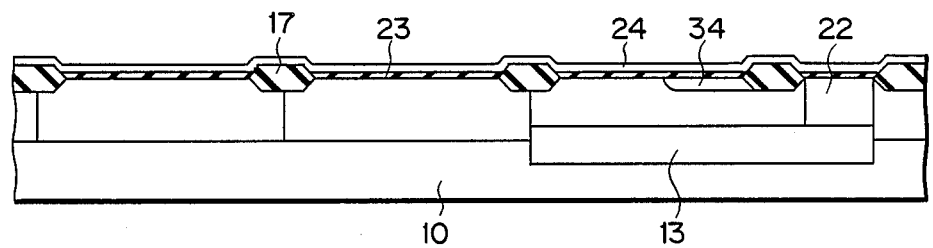

First gate poly-Si layer 24 of 1500 Å in thickness is deposited on the surface of the semiconductor structure as shown in FIG. 2C.

Figure 2D:
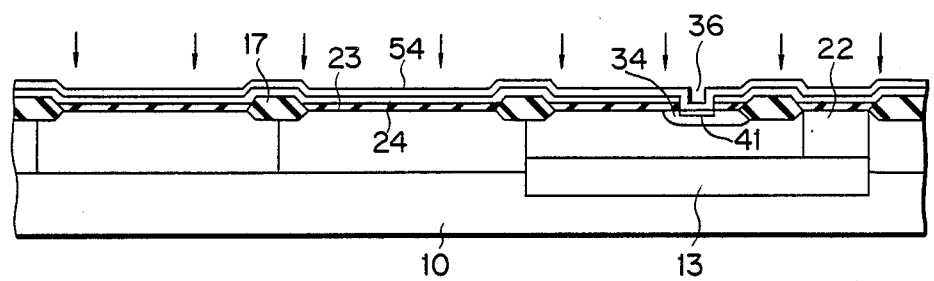

Hole 36 for an emitter formation area is formed in the surface portion of the semiconductor device as shown in FIG. 2D in which case the hole is formed by an RIE (reactive ion etching) for poly-Si layer 24 and by NH$_4$F for oxide film 23. Then second gate poly-Si 54 of 500 Å in thickness is deposited on the surface of the resultant structure and As ions are implanted into the surface portion of the semiconductor structure at an acceleration voltage of 50 KeV and dose of $5\times10^{15}$ cm$^{-2}$, followed by an anneal step conducted for 10 seconds at 1000° C. in a N$_2$ atmosphere. Reference numeral 41 represents an emitter region.

Figure 2E:
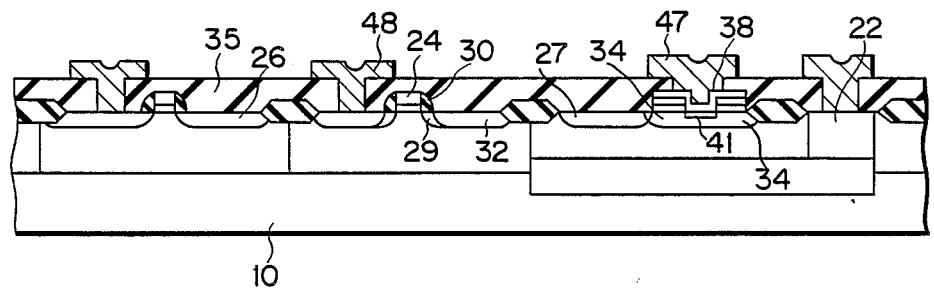

A patterning step is conducted for gate and emitter portions as shown in FIG. 2E and a source and drain 26 for P channel MOSFET are formed. BF$_2$+ ions are implanted at an acceleration voltage of 50 KeV and dose of $5\times10^{15}$ cm$^{-2}$ into the surface portion of the semiconductor structure and phosphorus ions are implanted at an acceleration voltage of 60 KeV and dose of $4\times10^{13}$ cm$^{-2}$ into the surface portion of the semiconductor structure for LDD type NMOS transistor formation to form N$^-$ layer 29 and an oxidation step is carried out for 30 minutes at 900° C. in an O$_2$ atmosphere. Then a CVD SiO$_2$ film of 2000 Å in thickness is deposited on the structure surface to provide side wall 30 for LLD type transistor formation. As ions are implanted into the N channel transistor at an acceleration voltage of 60 KeV and dose of $5\times10^{15}$ cm$^{-2}$ to form N$^+$ layer 32, followed by a post-oxidation step performed for 30 minutes at 900° C. in an O$_2$ atmosphere. An insulating interlayer (CVD SiO$_2$) and BPSG film 35 are deposited, contact holes are formed and Al wiring layer 48 is formed on the semiconductor structure.

In the conventional technique, it is only possible to provide a transistor having a current amplification factor h$_{FE}$ of 100, cut-off frequency ft of 4GHz and emitter resistance of 1 k$\Omega$. According to the present invention, transistors with a current amplification current h$_{FE}$ of 200, cut-off frequency ft of 10 GHz and emitter resistance of 30 $\Omega$ can be formed simultaneously with the formation of CMOS transistors.

Although in the aforementioned embodiment only a poly-Si has been explained as being used for gate and emitter electrodes, it may be possible to provide silicide and poly-Si as a double-layer structure.

The present invention is not restricted to the aforementioned embodiments and can be changed or modified in a variety of ways without departing from the spirit and scope of the present invention.

Although in the aforementioned embodiment the gate electrode of the MOS transistor has been explained as being formed using a poly-Si layer, it may be formed using a high melting point metal, such as Mo and Ti or using a two-layer (a high melting point metal layer/poly-Si layer) structure.

In the respective embodiment as set forth above, the emitter electrode of the bipolar transistor may be formed of aluminum in place of poly-Si layer 38.

Although in the respective embodiment the present invention has been explained in connection with NPN transistors having an P type base, it can also be applied to PNP type bipolar transistors.

What is claimed is:

1. A method for manufacturing a semiconductor device comprising the steps of:
   (a) implanting impurity ions into a channel formation region for forming a MOS transistor with a dummy gate insulating film interposed; and
   (b) implanting impurity ions into an internal base formation region for forming a bipolar transistor subsequent to forming a gate insulating film.

2. The method according to claim 1, in which, an emitter electrode of said bipolar transistor is formed by depositing a first poly-Si layer 500 to 20000 A thick on said gate insulating film during said step (b); opening an emitter contact hole by etching said poly-Si layer and said gate insulating film to form said emitter contact hole; and subsequent to forming said emitter contact hole a second poly-Si layer 100 to 1000 A thick is deposited on a surface of the resultant semiconductor substrate and As ions are implanted at an acceleration voltage of 40 to 100 KeV and dose of $5\times10^{15}$ cm$^{-2}$ to $2\times10^{16}$ cm$^{-2}$ into the surface portion of the semiconductor substrate with said poly-Si layer interposed to provide an emitter electrode, whereby said gate insulating film is protected and the resistance of said emitter is lowered.

3. The method according to claim 2 in which subsequent to forming said emitter electrode a heat treatment is conducted on the resultant semiconductor structure for 10 to 60 seconds at 950 to 1100° C. to reduce the emitter resistance.

4. The method according to claim 3, wherein said heat treatment is performed after an insulating interlayer is re-flowed.

5. The method according to claim 2, in which subsequent to forming said emitter electrode a heat treatment is conducted on the resultant semiconductor structure for 10 to 60 seconds at 950 to 1100° C. to reduce the emitter resistance.

6. The method according to claim 5, wherein said heat treatment is performed after an insulating interlayer is re-flowed.

7. A method for manufacturing a semiconductor device comprising the steps of:
   (a) implanting impurity ions into a MOS transistor formation region in a surface portion of a semiconductor substrate to allow control of a threshold voltage level;
   (b) forming a gate electrode over said MOS transistor formation area;
   (c) forming source and drain regions of the MOS transistor by implanting impurity ions using said electrode as a mask;
   (d) forming an external base region by implanting impurity ions in a bipolar transistor formation area;
   (e) forming an internal base region, which contacts said external base region, by implanting impurity ions into said bipolar transistor formation area;
   (f) depositing an insulating interlayer on an entire surface of a resultant semiconductor structure;
   (g) forming in said insulating interlayer an opening which reaches a surface of said internal base region;
   (h) subsequent to depositing a poly-Si layer on an entire surface of the resultant semiconductor structure, leaving a portion of said poly-Si layer at an area near said opening; and
   (i) forming an emitter region and an emitter electrode of said bipolar transistor by implanting impurity ions into said internal base region with said poly-Si layer interposed.

8. The method according to claim 7, in which said poly-Si layer is left at an area near said opening and at another area to form a high resistance element at said another area.

9. The method according to claim 7, in which said gate electrode is formed of at least one material selected from the group consisting of a poly-Si layer, high melting point metal layer and high melting joint silicide.

10. The method according to claim 7, in which said emitter region and said emitter electrode are formed by implanting impurity ions into said portion of said poly-Si layer at said opening, at an acceleration of 40 to 100 KeV and dose of $5 \times 10^{15}$ /cm$^2$ to $2 \times 10^{16}$/cm$^2$, 11. The method according to claim 7, in which, subsequent to forming said emitter region and said emitter electrode, a heat treatment is conducted for 5 seconds to one minute at 950° to 1150° C. on the resultant semiconductor structure.

* * * * *